US007001253B2

(12) United States Patent
Zhou et al.

(10) Patent No.: US 7,001,253 B2
(45) Date of Patent: Feb. 21, 2006

(54) BORON-CONTAINING POLISHING SYSTEM AND METHOD

(75) Inventors: Renjie Zhou, Aurora, IL (US); Steven K. Grumbine, Aurora, IL (US); Issac K. Cherian, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 44 days.

(21) Appl. No.: 10/801,316

(22) Filed: Mar. 16, 2004

(65) Prior Publication Data

US 2004/0180612 A1 Sep. 16, 2004

Related U.S. Application Data

(63) Continuation of application No. 10/033,152, filed on Oct. 24, 2001, now Pat. No. 6,705,926.

(51) Int. Cl.
*B24B 1/00* (2006.01)

(52) U.S. Cl. ........................ 451/41; 451/285; 451/288; 156/227; 51/308; 252/79.1; 438/692

(58) Field of Classification Search .................. 451/41, 451/285–290; 438/692, 693; 156/227, 636, 156/645; 51/281, 308; 252/79.1, 79.4
See application file for complete search history.

(56) References Cited

U.S. PATENT DOCUMENTS 5,026,421 A 6/1991 Le Loarer et al.
5,468,682 A 11/1995 Homma
5,527,423 A 6/1996 Neville et al.
5,692,950 A * 12/1997 Rutherford et al. ......... 451/552
5,700,348 A 12/1997 Sakurai
5,700,383 A 12/1997 Feller et al.
5,738,800 A 4/1998 Hosali et al.
5,756,398 A 5/1998 Wang et al.
5,759,917 A 6/1998 Grover et al.
5,770,103 A 6/1998 Wang et al.
5,780,358 A 7/1998 Zhou et al.
5,783,489 A 7/1998 Kaufman et al.
5,800,577 A 9/1998 Kido
5,827,781 A 10/1998 Skrovan et al.
5,840,132 A 11/1998 Erdemir et al.
5,858,813 A * 1/1999 Scherber et al. ............ 438/693
5,863,307 A 1/1999 Zhou et al.
5,885,334 A 3/1999 Suzuki et al.
5,916,819 A 6/1999 Skrovan et al.
5,954,997 A * 9/1999 Kaufman et al. .......... 252/79.1
6,027,669 A 2/2000 Miura et al.
6,083,840 A 7/2000 Mravic, et al.
6,136,218 A 10/2000 Skrovan et al.
6,143,705 A 11/2000 Kakizawa et al.
6,169,034 B1 1/2001 Avanzino et al.
6,171,352 B1 1/2001 Lee et al.
6,174,227 B1 1/2001 Ishikawa
6,190,237 B1 * 2/2001 Huynh et al. ................. 451/41
6,194,317 B1 2/2001 Kaisaki et al.
6,238,592 B1 5/2001 Hardy et al.
6,276,996 B1 8/2001 Chopra

FOREIGN PATENT DOCUMENTS

EP 967 259 A1 12/1999
JP 2000-136375 5/2000
WO WO 00/28586 5/2000

* cited by examiner

*Primary Examiner*—Lee D. Wilson
*Assistant Examiner*—Anthony Ojini
(74) *Attorney, Agent, or Firm*—Caryn Borg-Breen

(57) ABSTRACT

The invention provides a chemical-mechanical polishing system comprising an abrasive, a carrier, and either boric acid, or a conjugate base thereof, wherein the boric acid and conjugate base are not present together in the polishing system in a sufficient amount to act as a pH buffer, or a water-soluble boron-containing compound, or salt thereof, that is not boric acid, and a method of polishing a substrate using the chemical-mechanical polishing system.

16 Claims, No Drawings

BORON-CONTAINING POLISHING SYSTEM AND METHOD

CROSS-REFERENCE TO RELATED PATENT APPLICATIONS

This patent application is a continuation of U.S. patent application Ser. No. 10/033,152, filed Oct. 24, 2001 now U.S. Pat. No. 6,705,926.

FIELD OF THE INVENTION

This invention pertains to boron-containing polishing systems and methods for their use in the chemical-mechanical polishing ("CMP") of a substrate.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in chemically-mechanically polishing semiconductor surfaces can result in poor surface quality. Because the performance of a semiconductor wafer is directly associated with the planarity of its surface, it is crucial to use a polishing composition and method that results in a high polishing efficiency, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

The use of acids in chemical-mechanical polishing compositions is commonly known in the art. For example, U.S. Pat. No. 5,858,813 describes a polishing composition comprising an aqueous medium, an abrasive, an oxidizing agent, and an organic acid, which purportedly enhances the selectivity of metal to oxide polishing rate. U.S. Pat. No. 5,800,577 describes a polishing composition comprising a carboxylic acid, an oxidizing agent, and water with the pH adjusted with an alkali metal to between 5 and 9. U.S. Pat. No. 5,733,819 describes a polishing composition comprising silicon nitride fine powder, water, and an acid. U.S. Pat. No. 6,048,789 describes a polishing composition comprising nitric and hydrofluoric acids for etching silica.

Acid buffers are used to control the pH of a polishing composition and, thus, maintain the polishing efficiency and uniformity of the polishing composition over time. For example, U.S. Pat. No. 6,190,237 describes a two-step polishing system comprising first step polishing with an acidic (pH=1 to 6) polishing composition followed by second step polishing with a neutral polishing composition comprising an abrasive and a pH buffering component (i.e., an acid or a salt thereof with a base or salt thereof), which purportedly maintains the desired pH of the second composition despite the presence of residual acidic polishing composition from the first step, thereby preventing the loss of polishing performance. U.S. Pat. No. 6,238,592 describes a polishing composition comprising an oxidizer, a passivating agent, a chelating agent, optional abrasive, and an ionic buffer to control pH (e.g., an acid in combination with its conjugate base salt) for use in semiconductor polishing.

Acids are also employed for cleaning semiconductor surfaces after completion of CMP. For example, U.S. Pat. No. 6,169,034 describes a method of removing abrasive particles from a semiconductor surface after CMP using a dilute acidic solution without buffing or scrubbing. U.S. Pat. No. 6,143,705 describes the use of a cleaning agent comprising an organic acid with carboxyl groups and a complexing agent with chelating ability.

A need remains, however, for polishing systems and polishing methods that will exhibit desirable planarization efficiency, uniformity, and removal rate during the polishing and planarization of substrates, while minimizing defectivity, such as surface imperfections and damage to underlying structures and topography during polishing and planarization.

The present invention seeks to provide such a chemical-mechanical polishing system and method. These and other advantages of the invention will be apparent from the description of the invention provided herein.

BRIEF SUMMARY OF THE INVENTION

The invention provides a chemical-mechanical polishing system comprising an abrasive, boric acid, or a conjugate base thereof, and an aqueous carrier, wherein the boric acid and conjugate base are not present together in the polishing system in a sufficient amount to act as a pH buffer. The invention also provides a chemical-mechanical polishing system comprising an abrasive, an aqueous carrier, and a water-soluble boron-containing compound that is not boric acid of formula I–VII as described herein. The invention further provides methods of polishing a substrate comprising contacting a substrate with one of the chemical-mechanical polishing systems described herein, and abrading at least a portion of the substrate to polish the substrate.

DETAILED DESCRIPTION OF THE INVENTION

The invention is directed to a chemical-mechanical polishing system comprising an abrasive and/or polishing pad, an aqueous carrier, and boric acid, or a conjugate base thereof, wherein the boric acid and conjugate base are not present together in the polishing system in a sufficient amount to act as a pH buffer. The invention is further directed to a chemical-mechanical polishing system comprising an abrasive and/or polishing pad, an aqueous carrier, and a water-soluble boron-containing compound that is not boric acid, or salt thereof, of formula I–VII:

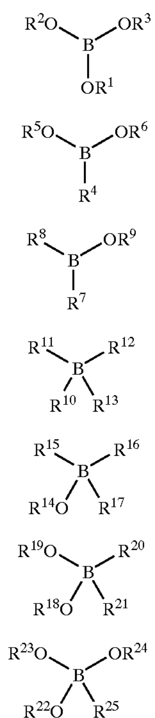

wherein, $R^1$, $R^2$, $R^3$, $R^5$, $R^6$, $R^9$, $R^{14}$, $R^{18}$, $R^{19}$, $R^{22}$, $R^{23}$, and $R^{24}$ are independently selected from the group consisting of H, $C_{1-20}$ alkyl, $C_{6-30}$ aryl including polycyclic aryl, cyclo($C_{3-20}$)alkyl, hetero($C_{6-30}$)aryl including polycyclic heteroaryl, $C_{3-20}$ heterocyclyl, $C_{2-20}$ alkenyl, and $C_{2-20}$ alkynyl, $R^4$, $R^7$, $R^8$, $R^{10}$, $R^{11}$, $R^{12}$, $R^{13}$, $R^{15}$, $R^{16}$, $R^{17}$, $R^{20}$, $R^{21}$, and $R^{25}$ are independently selected from the group consisting of H, halide, $C_{1-20}$ alkyl, $C_{6-30}$ aryl including polycyclic aryl, cyclo($C_{3-20}$)alkyl, hetero($C_{6-30}$)aryl including polycyclic heteroaryl, $C_{3-20}$ heterocyclyl, $C_{2-20}$ alkenyl, and $C_{2-20}$ alkynyl, any two R substituents of a formula can be linked through 1–16 atoms selected from the group consisting of C, N, O, and S to form a cyclic ring, and $R^1$–$R^{25}$ are optionally substituted with 1–5 substituents independently selected from the group consisting of halide, $C_{1-20}$ alkyl, $C_{1-20}$ alkoxy, thio($C_{1-20}$)alkyl, $C_{6-30}$ aryl including polycyclic aryl, $C_{6-30}$ ar($C_{1-20}$)alkyl, $C_{6-30}$ ar($C_{1-20}$)alkoxy, thio($C_{6-30}$)aryl, cyclo($C_{1-20}$)alkyl, cyclo($C_{3-20}$)alkyloxy, hetero($C_{6-30}$)aryl including polycyclic heteroaryl, $C_{3-20}$ heterocyclyl, heterocyclo ($C_{3-20}$)alkyloxy, $C_{2-20}$ alkenyl, $C_{2-20}$ alkynyl, B(OH)($C_{1-20}$ alkyl), B(OH)(cyclo($C_{1-20}$)alkyl), B(OH)($C_{6-30}$ aryl), B(OH)($C_{6-30}$ heteroaryl), $B(OH)_2$, thiol, hydroxy, halo($C_{1-20}$)alkyl, halo($C_{1-20}$)alkoxy, nitro, amino, $C_{1-20}$ alkylamino, di($C_{1-20}$)alkylamino, amino($C_{1-20}$)alkyl, $C_{1-20}$alkylamino($C_{1-20}$)alkyl, nitrile, cyano, carbonyl, $C_{1-20}$ alkylcarbonyl, carboxy, carboxy($C_{1-20}$)alkyl, silyl, and siloxy.

The abrasive (when present and suspended in the aqueous carrier) and either boric acid, or a conjugate base thereof, or water-soluble boron-containing compound, or salt thereof, of formula I–VII as described above, as well as any other components suspended in the liquid carrier, form the polishing composition of the CMP system.

The chemical-mechanical polishing system comprises an abrasive, a polishing pad, or both. Preferably, the CMP system comprises both an abrasive and a polishing pad. The abrasive can be any suitable abrasive. The abrasive can be fixed on the polishing pad and/or can be in particulate form and suspended in the aqueous carrier. The polishing pad can be any suitable polishing pad.

The abrasive can be any suitable abrasive, many of which are known in the art. For example, the abrasive particles can be natural or synthetic and include diamond (e.g., polycrystalline diamond), garnet, glass, carborundum, metal oxide (e.g., silica, fused alumina, ceramic alumina, chromia, and iron oxide), and the like. The abrasive particles can be coated particle abrasives. The abrasive preferably is a metal oxide abrasive and more preferably is selected from the group consisting of alumina, silica, titania, ceria, zirconia, germania, magnesia, co-formed products thereof, and combinations thereof. Most preferably, the abrasive is alumina or silica.

When the abrasive is present in the CMP system and is suspended in the liquid carrier (i.e., when the abrasive is a component of the polishing composition), any suitable amount of abrasive can be present in the polishing composition. Typically, about 0.1 wt. % or more (e.g., about 0.5 wt. % or more) abrasive will be present in the polishing composition. More typically, about 1 wt. % or more abrasive will be present in the polishing composition. The amount of abrasive in the polishing composition typically will not exceed about 30 wt. %, more typically will not exceed about 20 wt. % (e.g, will not exceed about 10 wt. %).

An aqueous carrier is used to facilitate the application of the abrasive (when present) and either boric acid, or conjugate base thereof, or water-soluble boron-containing compound, or salt thereof, to the surface of a suitable substrate to be polished or planarized. The aqueous carrier can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The pH of the chemical-mechanical polishing system of the invention is maintained in a range suitable for its intended end-use. The CMP system desirably has a pH in the range of about 2 to about 12 depending on the type of substrate to be polished. The polishing system can have a pH of less than about 7 (e.g., less than about 6, about 2 to about 5, or about 3 to about 4.5) or a pH of greater than about 7 (e.g., about 8 to about 14, about 9 to about 13, or about 10 to about 12). When the polishing system is used to polish a substrate layer comprising copper, the pH preferably is about 4 to about 8. When the polishing system is used to polish a substrate layer comprising tantalum, the pH preferably is about 8 to about 11. When the polishing system for tantalum polishing further comprises an oxidizer, the pH preferably is about 4 to about 7. When the polishing system is used to polishing a substrate layer comprising tungsten, the pH preferably is about 1.5 to about 5.

In one embodiment of the invention, the boric acid, or conjugate base thereof, is present in an amount and under conditions in the chemical-mechanical polishing system so that it does not function as part of a pH buffering system. Buffering occurs when a weak acid is combined with its conjugate base. For example, the combination of boric acid with a similar molar amount of ammonium tetraborate constitutes a buffered solution, whose pH can be maintained upon introduction of small amounts of strong acid or strong base within a range centered about the $pK_a$. The inventive chemical-mechanical polishing system does not contain boric acid in combination with a similar molar amount of its conjugate base, i.e., a borate salt, which together act to buffer the pH of the chemical-mechanical polishing system. Rather, when boric acid is present (i.e., $pH<pK_a^1$), the molar amount of conjugate base ($[H_2BO_3]^-$) is less than 20% the molar amount of boric acid (e.g., less than 10, less than 5%). When $[H_2BO_3]^-$ is present (i.e., $pK_a^1<pH<pK_a^2$) the molar amount of boric acid and $[HBO_3]^{2-}$ is less than 20% the molar amount of $[H_2BO_3]^-$ (e.g., less than 10%, less than 5%). Finally, when a salt of the conjugate base, $[HBO_3]^{2-}$, is present (i.e., $pH>pK_a^2$) the molar amount of $[H_2BO_3]^-$ is less than 20% the molar amount of $[HBO_3]^{2-}$ (e.g., less than 10%, less than 5%).

In another embodiment of the invention, a water-soluble boron-containing compound, or salt thereof, of formula I–VII, as described above, is present in the chemical-mechanical polishing system, with the proviso that the water soluble boron-containing compound is not boric acid or a salt thereof. When the water-soluble boron-containing compound is a salt, the counterion can be any suitable countercation. For example, the countercation can be ammonium, alkylammonium, di-, tri-, and tetra-alkylammoniun, potassium, cesium, and the like. The choice of countercation will depend on the type of substrate being polished and solubility in the liquid carrier. The compounds of formula I–VII include, for example, trialkylborates, triarylborates, boronic acids, diboronic acid, boronic acid esters, borinic acids, diborinic acid, borinic acid esters, tetraalkylborate salts, and tetraarylborate salts. Preferably, the water-soluble boron-containing compound is a trialkylborate (e.g., trimethylborate), borinic acid ester (e.g., diphenylboronic acid diethanolamine ester), boronic acid (e.g., phenylboronic acid), boronic acid ester (e.g., arylboronic acid-pinacol ester), or tetraarylborate salt (e.g., tetrabutylammonium tetraphenylborate). More preferably, the water-soluble boron-containing compound is a benzodioxaborole compound. Most preferably, the water-soluble boron-containing compound is B-bromocatecholborane. The water-soluble boron-containing compounds of the present invention can be generated in situ, for example, by a combination of boric acid with an appropriate alcohol, diol, carboxylic acid, or dicarboxylic acid or by a combination of a diboron ester (e.g., diboron pinacol ester or diboron catchol ester) with an appropriate organic compound (e.g., an aryl halide).

The chemical-mechanical polishing system optionally further comprises an oxidizing agent. The oxidizing agent can be any suitable oxidizing agent. Suitable oxidizing agents include inorganic and organic per-compounds, bromates, chlorates, nitrates, chromates, iodates, iron salts (e.g., nitrates, sulfates, EDTA, and citrates), alkaline earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is a peroxide or persulfate.

The chemical-mechanical polishing system optionally further comprises a film-forming agent. The film-forming agent can be any suitable film-forming agent. Typically, film-forming agents are organic compounds containing at least one heteroatom (N, O, or S)-containing functional group. For example, the film-forming agent can be a heterocyclic organic compound with at least one 5- or 6-member heterocycle ring as the active functional group, wherein the heterocycle ring contains at least one nitrogen atom (e.g., azoles). Preferably, the film-forming agent is a triazole, more preferably, 1,2,4-triazole or benzotriazole.

The chemical-mechanical polishing system optionally further comprises a chelating or complexing agent. Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). Preferably, the complexing agent is a carboxylate salt, more preferably an oxalate salt.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The chemical-mechanical polishing system optionally further comprises a surfactant. Suitable surfactants can include, for example, cationic surfactants, anionic surfactants, nonionic surfactants, amphoteric surfactants, mixtures thereof, and the like. One preferred surfactant is Triton DF-16.

The chemical-mechanical polishing system preferably comprises about 0.5 wt. % or more carrier-suspended abrasive particles, about 0.01 wt. % or more boric acid, conjugate base thereof, or a water-soluble boron-containing compound, or salt thereof, as described herein, and water.

The chemical-mechanical polishing systems described herein can be used to polish a substrate. The method of polishing a substrate comprises (i) contacting a substrate with the chemical-mechanical polishing system, and (ii) abrading at least a portion of the substrate to polish the substrate. The chemical-mechanical polishing system desirably is used in a method of polishing a substrate comprising at least one metal layer and optionally an insulating layer, whereby the substrate is contacted with the chemical-mechanical polishing system and at least a portion of the metal layer or insulating layer (if present) of the substrate is abraded such that the metal layer or insulating layer becomes polished. The substrate can be any suitable substrate (e.g., an integrated circuit, memory or rigid disks, metals, ILD layers, semiconductors, micro-electro-mechanical systems, ferroelectrics, magnetic heads, polymeric films, and low and high dielectric constant films) and can contain any suitable insulating, metal or metal alloy layer (e.g., metal conductive layer). The insulating layer can be a metal oxide, porous metal oxide, glass, organic polymer, fluorinated organic polymer, or any other suitable high or low-κ insulating layer. The insulating layer preferably is a silicon-based metal oxide. The metal layer preferably comprises copper, tungsten, tantalum, or titanium.

The CMP systems of the invention are capable of planarizing or polishing a substrate at a relatively high rate, with desirable planarization efficiency, uniformity, removal rate, and low defectivity exhibited during the polishing and planarization of the substrate.

The following examples further illustrate the invention but, of course, should not be construed as in any way limiting its scope.

EXAMPLE 1

This example demonstrates the effect on polishing rate of metal oxide and metal layers resulting from the addition of boric acid to a chemical-mechanical polishing composition.

Similar substrates comprising copper, tantalum, and silica layers were polished with two different chemical-mechanical polishing systems, each of which comprised the same polishing pad in conjunction with a different polishing composition (Polishing Compositions 1A and 1B). Polishing Composition 1A (control) comprised 3 wt. % alumina, 0.7 wt. % ammonium oxalate, 2.5 wt. % hydrogen peroxide, water, and no boric acid with pH adjusted to 7.7 with KOH. Polishing Composition 1B (invention) was the same as Polishing Composition 1A (control), except that it also comprised 2 wt. % boric acid. The removal rate for the copper, tantalum, and silica layers of the substrates were measured for each of the chemical-mechanical polishing systems.

With respect to the chemical-mechanical polishing system using Polishing Composition 1A (control), the removal rates were determined to be 9085, 160, and 135 Å/min, for copper, tantalum, and silica, respectively. With respect to the chemical-mechanical polishing system using Polishing Composition 1B (invention), the removal rates were determined to be 5140, 497, and 132 Å/min, for copper, tantalum, and silica, respectively. Thus, the removal rate for copper substantially decreased, while the removal rate for tantalum substantially increased. The removal rate for silica remained substantially constant.

These results demonstrate that the polishing selectivity of tantalum over copper can be substantially increased (~0.02 to ~0.1 Ta/Cu) through the use of the inventive chemical-mechanical polishing system. Notably, the substantially higher tantalum polishing rate observed for the inventive chemical-mechanical polishing system as compared to the control chemical-mechanical polishing system was not accompanied by an increase in polishing rate for the metal oxide layer.

EXAMPLE 2

This example further demonstrates the effect on polishing rate of metal oxide and metal layers resulting from the addition of boric acid to a chemical-mechanical polishing composition.

Similar substrates comprising copper, tantalum, and silica layers were polished with two different chemical-mechanical polishing systems, each of which comprised the same polishing pad in conjunction with a different polishing composition (Polishing Compositions 2A and 2B). Polishing Composition 2A (control) comprised 7.2 wt. % silica, 0.3 wt. % benzotriazole, 20 ppm Triton DF-16 surfactant, 0.37 wt. % potassium persulfate, water, and no boric acid with pH adjusted to 6 with KOH. Polishing Composition 2B (invention) was the same as Polishing Composition 2A (control), except that it also comprised 2 wt. % boric acid. The removal rate for the copper, tantalum, and silica layers of the substrates were measured for each of the chemical-mechanical polishing systems.

With respect to the chemical-mechanical polishing system using Polishing Composition 2A (control), the removal rates was determined to be 1360, 356, and 43 Å/min, for copper, tantalum, and silica, respectively. With respect to the chemical-mechanical polishing system using Polishing Composition 2B (invention), the removal rates were determined to be 62, 75, and 510 Å/min, for copper, tantalum, and silica, respectively. Thus, the removal rates for copper and tantalum substantially decreased, while the removal rate for silica substantially increased.

These results demonstrate that the polishing selectivity of silica over tantalum and copper can be substantially increased through the use of the inventive chemical-mechanical polishing system comprising boric acid.

EXAMPLE 3

This example demonstrates the effect on polishing rate of metal oxide and metal layers resulting from the addition of a water-soluble boron-containing compound to a chemical-mechanical polishing composition.

Similar substrates comprising a copper layer were polished with two different chemical-mechanical polishing systems, each of which comprised the same polishing pad in conjunction with a different polishing composition (Polishing Compositions 3A and 3B). Polishing Composition 3A (control) comprised 3 wt. % alumina, 0.7 wt. % ammonium oxalate, 2.5 wt. % hydrogen peroxide, water, and no boron-containing compound with pH adjusted to 7.7 with KOH. Polishing Composition 3B (invention) was the same as Polishing Composition 3A (control), except that it also comprised 1 wt. % B-bromocatecholborane. The removal rate for the copper layer of the substrates was measured for each of the chemical-mechanical polishing systems.

With respect to the chemical-mechanical polishing system using Polishing Composition 3A (control), the removal rate for the copper layer was determined to be 9085 Å/min with 0.19% within-wafer-non-uniformity (WIWNU). The WIWNU is a percentage calculated by dividing the standard deviation of removal rate by the average removal rate over the substrate and multiplying by 100. With respect to the chemical-mechanical polishing system using Polishing Composition 3B (invention), the removal rate was determined to be 12150 Å/min with only 7% WIWNU. Thus, the removal rate for copper substantially increased without any loss in polishing uniformity. In fact, the polishing uniformity actually improved with the presence of the water-soluble boron-containing compound.

This example demonstrates that the polishing rate of a metal layer can be substantially increased through the use of the inventive chemical-mechanical polishing system comprising a water-soluble boron-containing compound.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing system comprising:

(a) an abrasive and/or polishing pad, (b) boric acid, or a conjugate base thereof, and (c) an aqueous carrier, wherein the boric acid or conjugate base thereof is not present in the polishing system in a sufficient amount to act as a pH buffer.

2. The chemical-mechanical polishing system of claim 1, wherein the abrasive is a metal oxide.

3. The chemical-mechanical polishing system of claim 2, wherein the abrasive is selected from the group consisting of alumina, silica, titania, ceria, zirconia, germania, magnesia, co-formed products thereof, and combinations thereof.

4. The chemical-mechanical polishing system of claim 3, wherein the abrasive is alumina or silica.

5. The chemical-mechanical polishing system of claim 1, wherein the abrasive is fixed on a polishing pad.

6. The chemical-mechanical polishing system of claim 1, wherein the abrasive is in particulate form and is suspended in the carrier.

7. The chemical-mechanical polishing system of claim 1, wherein the carrier is water.

8. The chemical-mechanical polishing system of claim 1, wherein the system further comprises an oxidizing agent.

9. The chemical-mechanical polishing system of claim 8, wherein the oxidizing agent is a peroxide or persulfate.

10. The chemical-mechanical polishing system of claim 1, wherein the system further comprises d film-forming agent.

11. The chemical-mechanical polishing system of claim 10, wherein the film-farming agent is an azole.

12. The chemical-mechanical polishing system of claim 1, wherein the system comprises about 0.5 wt.% or more carrier-suspended abrasive particles, about 0.01 wt.% or more boric acid or conjugate base thereof, and water.

13. The chemical-mechanical polishing system of claim 1, wherein the system further comprises a complexing agent.

14. A method of polishing a substrate comprising:

(i) contacting a substrate with a chemical-mechanical polishing system comprising;

(a) an abrasive and/or polishing pad, (b) boric acid, or conjugate base thereof, and (c) an aqueous carrier, wherein the boric acid or conjugate base thereof is not present in the polishing system in a sufficient amount to act as a pH buffer, and (ii) abrading at least a portion of the substrate to polish the substrate.

15. The method of claim 14, wherein the substrate comprises a metal oxide layer and a metal layer.

16. The method of claim 15, wherein the metal layer comprises copper, tungsten, tantalum, or titanium.

* * * * *